US008927626B2

(12) United States Patent
Kamiya et al.

(10) Patent No.: US 8,927,626 B2
(45) Date of Patent: Jan. 6, 2015

(54) LATENT CURING AGENT (75) Inventors: Kazunobu Kamiya, Tochigi (JP);
Makoto Yoshinari, Tochigi (JP)

(73) Assignee: Dexerials Corporation, Tokyo (JP)

(*) Notice: Subject to any disclaimer, the term of this patent is extended or adjusted under 35 U.S.C. 154(b) by 0 days.

(21) Appl. No.: 12/213,439

(22) Filed: Jun. 19, 2008

(65) Prior Publication Data

US 2008/0319110 A1    Dec. 25, 2008

Related U.S. Application Data (63) Continuation of application No. 10/569,277, filed as application No. PCT/JP2004/012895 on Aug. 30, 2004, now abandoned.

(30) Foreign Application Priority Data

Sep. 8, 2003  (JP) ................................. 2003-315984
Aug. 5, 2004  (JP) ................................. 2004-228771
Aug. 26, 2004 (JP) ................................. 2004-246231

(51) Int. Cl.
C08G 18/22   (2006.01)
C08G 59/18   (2006.01)
C08G 59/70   (2006.01)
C08G 18/79   (2006.01)
C08G 18/58   (2006.01)
C08G 18/08   (2006.01)
H05K 3/32    (2006.01)

(52) U.S. Cl.
CPC .............. *C08G 59/70* (2013.01); *C08G 59/188* (2013.01); *C08G 18/79* (2013.01); *C08G 18/58* (2013.01); *C08G 18/0852* (2013.01); *H05K 3/323* (2013.01)
USPC ........................................................ 523/211

(58) Field of Classification Search
CPC ........................................................ C08G 18/22
USPC ......................................... 524/356; 523/211
See application file for complete search history.

(56) References Cited

U.S. PATENT DOCUMENTS

| 3,639,259 | A | 2/1972 | Scarpelli |
| 5,914,193 | A * | 6/1999 | Ono et al. ...................... 428/451 |
| 6,010,778 | A * | 1/2000 | Kimura et al. ................. 428/328 |
| 6,027,816 | A * | 2/2000 | Ono et al. ...................... 428/447 |
| 6,248,454 | B1 | 6/2001 | Ikemura |
| 6,362,251 | B1 * | 3/2002 | Alkemper et al. ............ 523/116 |
| 6,737,145 | B1 * | 5/2004 | Watanabe et al. ............ 428/64.4 |
| 6,794,038 | B2 * | 9/2004 | Matsushima ................. 428/407 |
| 6,822,341 | B1 * | 11/2004 | Ahsan ........................... 257/793 |
| 7,785,715 | B2 * | 8/2010 | Tsumura et al. .............. 428/447 |
| 7,851,520 | B2 * | 12/2010 | Kamiya ......................... 523/457 |
| 8,039,522 | B2 * | 10/2011 | Kamiya ......................... 521/55 |
| 8,044,117 | B2 * | 10/2011 | Matsushima et al. ......... 523/212 |
| 8,198,342 | B2 * | 6/2012 | Kamiya ......................... 521/110 |
| 8,349,397 | B2 * | 1/2013 | Kojima et al. ................ 427/164 |
| 8,349,973 | B2 * | 1/2013 | Kamiya ......................... 525/528 |
| 2002/0076631 | A1 | 6/2002 | Itami et al. |
| 2002/0151627 | A1 | 10/2002 | Matsushima |
| 2002/0177654 | A1 * | 11/2002 | Erdem et al. .................. 524/801 |
| 2004/0109943 | A1 | 6/2004 | Matsushima et al. |
| 2005/0107494 | A1 * | 5/2005 | Matsushima et al. ......... 523/211 |
| 2007/0010636 | A1 * | 1/2007 | Kamiya et al. ................ 525/523 |
| 2008/0319110 | A1 * | 12/2008 | Kamiya et al. ................ 524/356 |
| 2009/0209669 | A1 * | 8/2009 | Kamiya ......................... 521/55 |
| 2009/0275708 | A1 * | 11/2009 | Kamiya ......................... 525/452 |
| 2010/0143604 | A1 * | 6/2010 | Matsushima et al. ......... 427/458 |
| 2010/0249338 | A1 * | 9/2010 | Kamiya ......................... 525/475 |
| 2010/0323124 | A1 * | 12/2010 | Vartabedian et al. ......... 427/569 |
| 2010/0324170 | A1 * | 12/2010 | Kamiya ......................... 523/206 |
| 2010/0331435 | A1 * | 12/2010 | Kamiya ......................... 521/90 |
| 2011/0196110 | A1 * | 8/2011 | Kamiya ......................... 525/454 |
| 2012/0119156 | A1 * | 5/2012 | Kamiya ......................... 252/500 |

FOREIGN PATENT DOCUMENTS

| CN | 1256288 A | 6/2000 |
| EP | 1 009 025 A2 | 6/2000 |
| JP | A-11-092549 | 4/1999 |
| JP | A-11-092550 | 4/1999 |
| JP | A-11-343332 | 12/1999 |
| JP | A-2000-230039 | 8/2000 |
| JP | A-2002-212537 | 7/2002 |
| JP | A-2002-363255 | 12/2002 |
| JP | A-2002-368047 | 12/2002 |
| JP | A-2006-070051 | 3/2006 |
| JP | A-2006-291053 | 10/2006 |

(Continued)

OTHER PUBLICATIONS

English machine translation of JP 11-343332. Dec. 14, 1999.*
Aug. 22, 2012 Japanese Office Action issued in JP 2009-118207 (with English-language Translation).
Jun. 7, 2011 Office Action issued in Korean Patent Application No. 10-2006-7004666 (with translation).
Mar. 9, 2010 International Preliminary Report on Patentability issued in International Application No. PCT/JP2008/054927; with English-language translation.
Jun. 17, 2008 International Search Report issued in International Application No. PCT/JP2008/054927.

(Continued)

*Primary Examiner* — Mark Eashoo
*Assistant Examiner* — Megan McCulley
(74) *Attorney, Agent, or Firm* — Oliff PLC (57) ABSTRACT

A latent curing agent that can cure a thermosetting epoxy resin in a relatively short period of time and at a relatively low temperature has a structure in which an aluminum chelating agent is held by a porous resin carrier obtained through interfacial polymerization of a polyfunctional isocyanate compound. The aluminum chelating agent is preferably a complex compound comprising β-ketoenolate anion ligands coordinated to aluminum. The latent curing agent can be produced by dissolving the aluminum chelating agent and the polyfunctional isocyanate compound in a volatile organic solvent, adding the resulting solution to an aqueous phase containing a dispersing agent, and stirring the resulting mixture to cause interfacial polymerization of the isocyanate compound while the mixture is being heated.

15 Claims, 10 Drawing Sheets

(56) References Cited

FOREIGN PATENT DOCUMENTS

| | | |
|---|---|---|
| JP | A-2008-031325 | 2/2008 |
| JP | A-2009-118207 | 5/2009 |
| JP | B2-4381255 | 12/2009 |
| WO | WO03068840 A1 * | 8/2003 |
| WO | WO 2006/075415 A1 | 7/2006 |

OTHER PUBLICATIONS

U.S. Appl. No. 12/672,806, entitled "Microcapsule-Type Latent Curing Agent," Kamiya, filed Feb. 9, 2010.

Nov. 8, 2012 Advisory Action issued in U.S. Appl. No. 12/672,806.
Oct. 7, 2011 Office Action issued in U.S. Appl. No. 12/672,806.
Aug. 3, 2012 Office Action issued in U.S. Appl. No. 12/672,806.
Jan. 4, 2013 Notification of Reasons for Refusal issued in Japanese Application No. 2009-118207; with translation.
Apr. 15, 2014 Notification of Reason(s) for Refusal issued in Japanese Patent Application No. 2013-042937 (with English-language translation).
May 22, 2014 Office Action issued in U.S. Appl. No. 12/672,806.

* cited by examiner

LATENT CURING AGENT

This is a Continuation of application Ser. No. 10/569,277 filed Feb. 23, 2006, which in turn is a PCT National Stage of Application NO. PCT/JP2004/012895 filed Aug. 30, 2004, which claims the benefit of Japanese Applications Nos. JP2003-315984, JP2004-228771 and JP2004-246231 filed Sep. 8, 2003, Aug. 5, 2004 and Aug. 26, 2004, respectively. The disclosures of the prior applications are hereby incorporated by reference herein in their entirety.

TECHNICAL FIELD

The present invention relates to a latent curing agent that can initiate curing of thermosetting epoxy resin compositions at relatively low temperature. The present invention also relates to a method for producing such a latent curing agent, as well as to a thermosetting epoxy resin composition that contains the latent curing agent and is thus highly stable during storage.

BACKGROUND ART

Thermosetting epoxy resin compositions are widely used as adhesives and molding materials. Among different curing agents used to cure thermosetting epoxy resin compositions are imidazole latent curing agents. These imidazole latent curing agents do not cure under normal storage conditions and are thus widely used to make thermosetting epoxy resin compositions into one-pack type curable compositions that are easy to handle and are stable during storage. One example of such imidazole latent curing agents includes an agent provided in the form of microcapsules in which particles of an imidazole compound are coated with a cured epoxy resin. The imidazole compound is capable of curing epoxy resins.

However, since the coating of this microcapsule-type imidazole latent curing agent is mechanically and thermally stable, this latent curing agent must be heated to 180° C. or above under pressurized conditions to initiate the curing reaction. This makes the imidazole latent curing agent inapplicable to recently developed epoxy resin compositions that are designed to cure at low-temperatures.

For this reason, new latent curing agents have been proposed that can cure epoxy resin compositions quickly at low temperature. One is a microcapsule-type aluminum chelating agent-based latent curing agent (Japanese Patent Application Laid-Open No. 2002-212537). This latent curing agent comprises particles of an aluminum chelating agent (mother particles) and fine particles of polyvinyl alcohol (child particles) hybridized to the surface of the mother particles. The aluminum chelating agent acts with a silane coupling agent to cause an epoxy resin to polymerize cationically. Another is also a microcapsule-type aluminum chelating agent-based latent curing agent (Japanese Patent application Laid-Open No. 2002-363255). This agent comprises particles of an aluminum chelating agent (mother particles) and fine particles of a fluorine resin (child particles) hybridized to the surface of the mother particles.

The detail of the curing process of the aluminum chelator-based latent curing agent is described in Japanese Patent Application Laid-Open No. 2002-212537, paragraphs 0007 through 0010.

DISCLOSURE OF THE INVENTION

However, the hybridization technique for forming microcapsules of aluminum chelator-based latent curing agents involves allowing child particles to collide to mother particles to form the microcapsule wall. As a result, the microcapsules obtained tend to have non-uniform and rough surfaces, and the resulting curing agents cannot achieve stable curing characteristics, making it difficult to control the conditions for curing.

In view of the aforementioned problems of the conventional art, it is an objective of the present invention to provide an aluminum chelator-based latent curing agent that can cure thermosetting epoxy resins in a relatively short period of time and at a relatively low temperature. It is another objective of the present invention to provide a method for producing such an aluminum chelator-based latent curing agent in which curing conditions for the curing agent can be controlled in a relatively easy fashion. It is still another objective of the present invention to provide a thermosetting resin composition containing such a latent curing agent.

MEANS TO SOLVE THE PROBLEMS

The present inventors have found that the above-described objectives can be achieved by a polymer obtained through interfacial polymerization of a polyfunctional isocyanate compound, which is carried out in the presence of an aluminum chelating agent. The present invention has been achieved based on this discovery.

Accordingly, the present invention provides a latent curing agent comprising an aluminum chelating agent and a porous resin carrier for the aluminum chelating agent, the porous resin carrier being obtained through interfacial polymerization of a polyfunctional isocyanate compound.

The present invention also provides a method for producing the above-described latent curing agent, comprising dissolving an aluminum chelating agent and a polyfunctional isocyanate compound in a volatile organic solvent, adding the resulting solution to an aqueous phase containing a dispersing agent, and stirring the resulting mixture while the mixture is heated to cause interfacial polymerization of the isocyanate compound.

The present invention further provides a thermosetting resin composition comprising the latent curing agent, a silane coupling agent and a thermosetting resin.

ADVANTAGE OF THE INVENTION

The latent curing agent of the present invention, which consists of an aluminum chelating agent and a porous resin carrier for the aluminum chelating agent, the carrier being obtained through interfacial polymerization of a polyfunctional isocyanate compound, can cure thermosetting epoxy resins at a relatively low temperature and in a relatively short period of time. In addition, curing conditions for the latent curing agent can be controlled in a relatively easy fashion by the method of the present invention for producing the latent curing agent, since the method involves dissolving an aluminum chelating agent and a polyfunctional isocyanate compound in a volatile organic solvent, adding the resulting solution to an aqueous phase containing a dispersing agent, and stirring the mixture while the mixture is heated to cause interfacial polymerization of the isocyanate compound.

REFERENCE NUMERALS

1. Latent curing agent
2. Porous resin matrix
3. Pore

BEST MODE FOR CARRYING OUT THE INVENTION

The latent curing agent of the present invention consists of an aluminum chelating agent and a porous resin carrier for the aluminum chelating agent, obtained through interfacial polymerization of a polyfunctional isocyanate compound. The aluminum chelating agent imparts to the latent curing agent an ability to cure thermosetting resin compositions quickly and at low temperatures. Furthermore, the aluminum chelating agent is carried by the porous resin carrier obtained through interfacial polymerization. Therefore, when a thermosetting resin composition is mixed with the latent curing agent (in other words, when a one-pack type composition is composed of the thermosetting resin composition and the latent curing agent), the thermosetting resin composition is improved in respect of stability during storage.

Figure 1A:
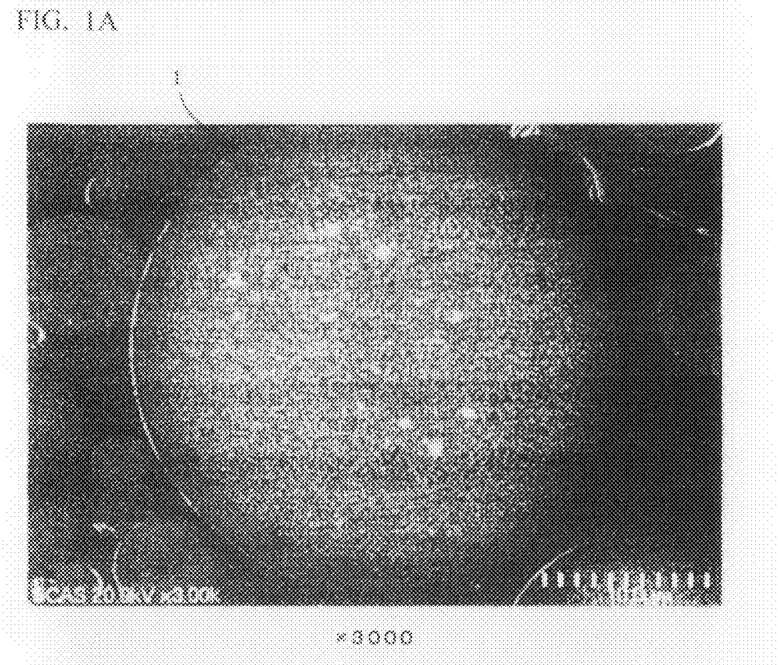
FIG. 1A is an electron micrograph of a single particle of a latent curing agent.
Figure 1B:
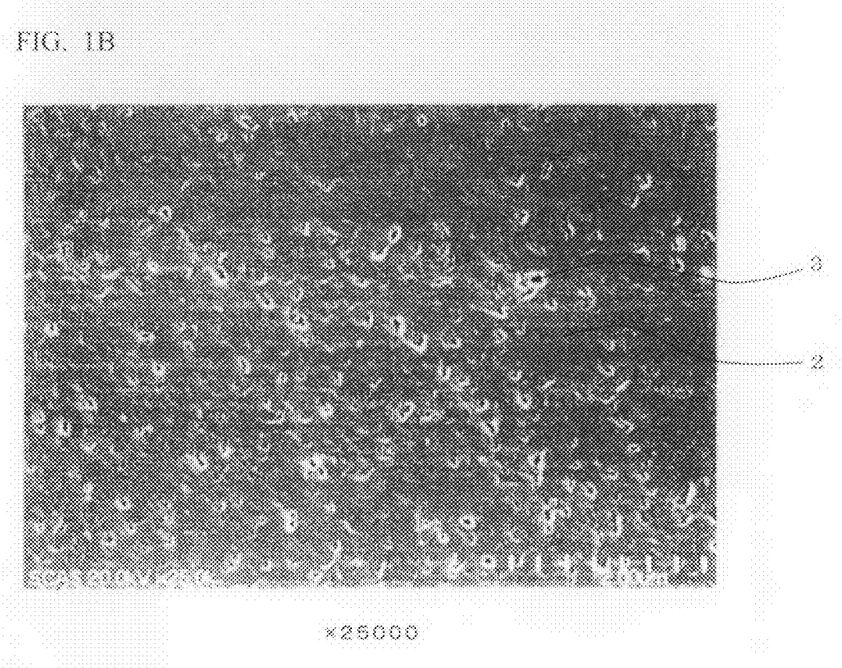
FIG. 1B is an enlarged electron-micrograph showing the central region of the particle of the latent curing agent of FIG. 1A.

Rather than the simple microcapsule structure in which the shell of porous resin is formed around the aluminum chelator core, the latent curing agent 1 of the present invention has a structure in which the aluminum chelating agent is retained in numerous pores 3 formed in a porous resin matrix 2 as shown in an electron micrograph of the latent curing agent 1 (FIG. 1A) and an enlarged electron-micrograph of the central region of the latent curing agent (FIG. 1B).

The latent curing agent 1 of the present invention is produced by interfacial polymerization and thus is formed into spheres, which are preferably sized from 0.5 to 100 μm in terms of the curability and dispersibility. The pores 3 are preferably sized from 5 to 150 nm in terms of the curability and latency.

If the degree of crosslinking of the porous resin is too small, the latency of the latent curing agent 1 tends to decrease, whereas if the degree of crosslinking of the porous resin is too large, the heat response of the latent curing agent tends to decrease. Thus, a porous resin with a controlled degree of crosslinking is preferably used depending on the intended use of the curing agent. The degree of crosslinking of the porous resin can be determined by micro-compression test.

It is preferred that the latent curing agent 1 of the present invention is substantially organic solvent-free. Specifically, it preferably contains 1 ppm or less organic solvent for use in interfacial polymerization to ensure stability of curing.

The amount of the aluminum chelating agent relative to the porous resin in the latent curing agent 1 of the present invention is preferably 10 to 200 parts by mass and, more preferably, 10 to 150 parts by mass relative to 100 parts by mass of the porous resin. Too little of the aluminum chelating agent results in a decreased heat response of the latent curing agent, whereas too much of the aluminum chelating agent results in a decreased latency of the latent curing agent.

One example of the aluminum chelating agents for use in the latent curing agent of the present invention includes a group of complex compounds in which three β-ketoenolate anions are coordinated to aluminum as shown in the following formula (1):

(1)

wherein $R^1$, $R^2$, and $R^3$ are each independently an alkyl or alkoxyl group. Examples of the alkyl group include methyl and ethyl. Examples of the alkoxyl group include methoxy, ethoxy, and oleyloxy.

Specific examples of the aluminum chelating agents represented by the formula (1) include aluminum tris(acetylacetonate), aluminum tris(ethylacetoacetate), aluminum monoacetylacetonate bis(ethylacetoacetate), aluminum monoacetylacetonate bisoleylacetoacetate, ethylacetoacetate aluminum diisopropylate, and alkylacetoacetate aluminum diisopropylate.

The polyfunctional isocyanate compound for use in the present invention preferably contains two or more, in particular three isocyanate groups in one molecule. Preferred examples of such trifunctional isocyanate compounds are trimethylolpropane (TMP) adducts obtained by reacting 1 mol of TMP with 3 mol of a diisocyanate compound, as represented by the following formula (2); isocyanurates obtained by self-condensation of 3 mol of a diisocyanate compound, as represented by the following formula (3); and biurets obtained by condensation of diisocyanate urea obtained from 2 mols of 3 mols of a diisocyanate compound with the remaining 1 mol of a diisocyanate compound, as represented by the following formula (4):

In the formulas (2) through (4), the substituent R is the moiety of the diisocyanate molecule other than the isocyanate group. Specific examples of the diisocyanate compound include toluene 2,4-diisocyanate, toluene 2,6-diisocyanate, m-xylylene diisocyanate, hexamethylene diisocyanate, hexahydro-m-xylylene diisocyanate, isophorone diisocyanate, and methylenediphenyl-4,4'-diisocyanate.

During the interfacial polymerization of the polyfunctional isocyanate compounds for forming the porous resin, a part of the isocyanate group is hydrolyzed to an amino group, which reacts with an isocyanate group by forming a urea bond, thus forming a porous polyurea. When the latent curing agent composed of such a porous resin and the aluminum chelating agent retained in the pores of the resin is heated for curing, the retained aluminum chelating agent comes into contact with the silane coupling agent and the thermosetting resin that coexists with the latent curing agent, though the underlying mechanism is unknown. As a result, the curing reaction proceeds.

Although the aluminum chelating agent is considered to be present on the outer surface of the particles of the latent curing agent due to its structure, the chelating agent on the surface of the latent curing agent is immediately inactivated by the water present in the reaction system during the interfacial polymerization. Thus, only the aluminum chelating agent retained within the porous resin remains active. This active chelating agent within the porous resin is thought to be responsible for the latency of the resulting curing agent.

The latent curing agent of the present invention can be produced in the following manner: An aluminum chelating agent and a polyfunctional isocyanate compound are dissolved in a volatile organic solvent, and the resulting solution is added to an aqueous phase containing a dispersing agent. The mixture is then stirred while heated to cause interfacial polymerization of the isocyanate compound.

In this method, the aluminum chelating agent and the polyfunctional isocyanate compound are first dissolved in a volatile organic solvent to form a solution to serve as the organic phase in the interfacial polymerization. The volatile organic solvents are used for the following reason: Other organic solvents with high boiling points of 300° C. or above that are normally used in interfacial polymerization processes do not evaporate during the interfacial polymerization. As a result, the chance of isocyanate coming into contact with water does not increase significantly, so that the polymerization does not proceed to a sufficient degree at the interface. This makes it difficult to obtain polymer products with high shape-retaining characteristic by interfacial polymerization, and even if it is obtained, the high-boiling-point solvent remaining in the polymer product undesirably affects the physical properties of the cured product of the thermosetting resin composition when the latent curing agent is used to cure the thermosetting resin composition. For this reason, volatile organic solvents are used as organic solvents in the preparation of the organic phase.

Preferably, the volatile organic solvents can effectively dissolve both the aluminum chelating agent and the polyfunctional isocyanate compound (i.e., the solubility of each solute in the organic solvent is preferably 0.1 g/ml (organic solvent) or higher), is substantially incompatible with water (i.e., the solubility of water in the organic solvent is 0.5 g/ml (organic solvent) or lower), and has a boiling point of 100° C. or below under the atmospheric pressure. Examples of such volatile organic solvents are alcohols, acetic acid esters, and ketones. Of these solvents, ethyl acetate is particularly preferred because of its high polarity, low boiling point, and poor solubility in water.

The volatile organic solvent is preferably used in an amount of 100 to 500 parts by mass relative to 100 parts by mass of the sum of the aluminum chelating agent and the polyfunctional isocyanate compound. Too little of the volatile organic solvent results in a decreased latency, whereas too much of solvent causes a decrease in the heat response.

The viscosity of the solution to serve as the organic phase can be reduced, for example, by using a relatively large amount of the volatile organic solvent within the above-specified range. Lowering the viscosity can improve the efficiency of stirring the solution. This enables the formation of fine, uniform particles of the organic phase in the reaction system. As a result, the size of the particles of the resultant latent curing agent can be controlled to submicron to several microns to follow a monodisperse size distribution. The viscosity of the organic phase solution is preferably adjusted to 1 to 2.5 mPa·S.

Figure 8A:
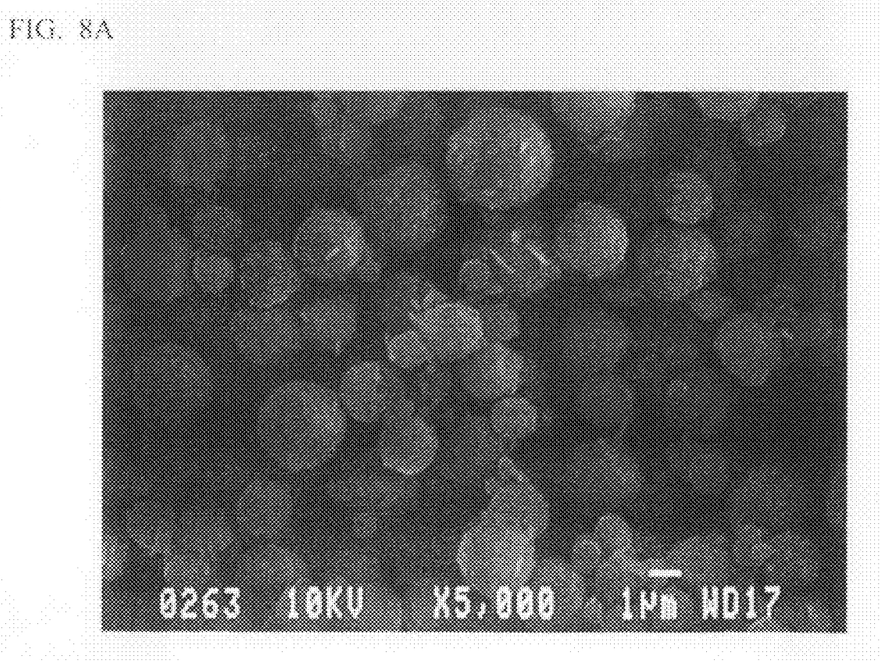
FIG. 8A is an electron micrograph of particles of a conventional latent curing agent using partially saponified PVA.
Figure 8B:
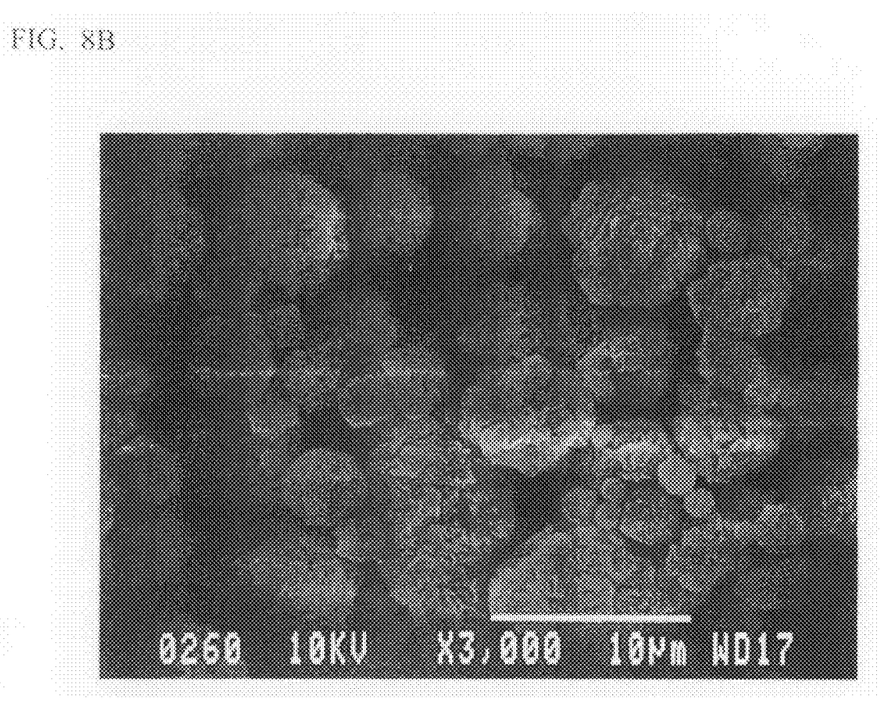
FIG. 8B is an electron micrograph of particles of a conventional latent curing agent using fully saponified PVA.

When PVA is used to emulsify the polyfunctional isocyanate compound, the hydroxide groups of PVA react with the polyfunctional isocyanate compound, causing deposition of a by-product material around the particles of the latent curing agent (FIG. 8A, with partially saponified PVA) or deformation of the particles (FIG. 8B, with fully saponified PVA). The measures to prevent these phenomena include facilitating of the reaction between the polyfunctional isocyanate compound and water and suppressing of the reaction between the polyfunctional isocyanate compound and PVA.

To facilitate the reaction between the polyfunctional isocyanate compound and water, the aluminum chelating agent is used in an amount of preferably one-half or less, and more preferably one-third or less of the weight of the polyfunctional isocyanate compound. In this manner, the chance of the polyfunctional isocyanate compound coming into contact with water increases, so that the polyfunctional isocyanate compound tends to react with water before PVA comes into contact with the surfaces of the particles of the organic phase.

In addition, to suppress the reaction between the polyfunctional isocyanate compound and PVA, the amount of the aluminum chelating agent in the organic phase is increased. Specifically, the aluminum chelating agent is used in an amount of preferably 1.0 or more times, and more preferably 1.0 to 2.0 times (by weight) the polyfunctional isocyanate compound. In this manner, the concentration of isocyanate at the surface of the particles of the organic phase is decreased. Furthermore, the chance of the polyfunctional isocyanate compound reacting with PVA can be decreased since the reaction (interfacial polymerization) rate of the polyfunctional isocyanate compound with the amine generated by hydrolysis is higher than that with the hydroxyl groups.

While the aluminum chelating agent and the polyfunctional isocyanate compound may be dissolved in the volatile organic solvent under atmospheric pressure and at room temperature, the resulting reaction mixture may be heated, if necessary.

In this method, the organic phase solution obtained by dissolving the aluminum chelating agent and the polyfunctional isocyanate compound in the volatile organic solvent is then added to an aqueous phase containing a dispersing agent and the resulting mixture is stirred while heated to cause interfacial polymerization of the isocyanate compound. The dispersing agent may be polyvinyl alcohol, carboxymethylcellulose, gelatin, or other dispersing agents commonly used in the interfacial polymerization processes. The dispersing agent is typically used in an amount of 0.1 to 10.0 mass % of the aqueous phase.

The amount of the organic phase solution relative to the aqueous phase is preferably 5 to 50 parts by mass relative to 100 parts by mass of the aqueous phase. Too little of the organic phase solution results in polydisperse size distribution, whereas too much of the organic phase solution causes formation of aggregates of fine particles.

Emulsification for the interfacial polymerization is preferably carried out under such a stirring condition that the size of the organic phase becomes 0.5 to 100 µm (e.g., under stirring speed 8000 rpm or more using a homogenizer). The reaction mixture is typically stirred under atmospheric pressure at a temperature of 30 to 80° C. for 2 to 12 hours while being heated.

Upon completion of the interfacial polymerization, the resulting fine particles of the polymer are separated by filtration and are allowed to dry to give the latent curing agent of the present invention.

The above-described production method of the present invention makes it possible to control the curing characteristics of the latent curing agent by changing the types and the amounts of the polyfunctional isocyanate compound and the aluminum chelating agent, and the conditions for interfacial polymerization. For example, lowering temperature for the polymerization can decrease the curing temperature. Conversely, increasing temperature for polymerization can increase the curing temperature.

The latent curing agent of the present invention can be used in the same applications as the conventional imidazole latent curing agents. The latent curing agent of the present invention is preferably used together with a silane coupling agent and a thermosetting resin to provide thermosetting resin compositions that cure quickly at low temperatures.

The amount of the latent curing agent in the thermosetting resin composition is typically 1 to 70 parts by mass, and more preferably 1 to 50 parts by mass relative to 100 parts by mass of the thermosetting resin. Too little of the latent curing agent cannot provide sufficient curing characteristics, whereas too much of the agent results in a decrease in the resin properties (e.g., flexibility) of the cured product of the composition.

The silane coupling agent, as described in paragraphs 0007 through 0010 of Japanese Patent Application Laid-Open No. 2002-212537, cooperates with the aluminum chelating agent to initiate cationic polymerization of thermosetting resins (e.g., thermosetting epoxy resins). The silane coupling agent has 1 to 3 lower alkoxyl groups in its molecule and may have vinyl, styryl, acryloyloxy, methacryloyloxy, epoxy, amino, mercapto, and other functional groups that can react with the functional groups of the thermosetting resins.

Since the latent curing agent of the present invention is a cationic curing agent, the coupling agents with amino or mercapto groups can be used only if the amino or mercapto groups substantially do not capture the generated cation species.

Examples of such silane coupling agents include vinyltris (β-methoxyethoxy)silane, vinyltriethoxysilane, vinyltrimethoxysilane, γ-styryltrimethoxysilane, γ-methacryloxypropyltrimethoxysilane, γ-acryloxypropyltrimethoxysilane, β-(3,4-epoxycyclohexyl) ethyltrimethoxysilane, γ-glycycloxypropyltrimethoxysilane, γ-glycycloxypropylmethyldiethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, and γ-chloropropyltrimethoxysilane.

The amount of the silane coupling agent in the thermosetting resin composition is typically 50 to 1500 parts by mass, and more preferably 300 to 1200 parts by mass relative to 100 parts by mass of the latent curing agent. Too little of the silane coupling agent results in a decreased curability, whereas too much of the agent causes a decrease in the resin properties (e.g., stability during storage) of the cured product of the composition.

Examples of the thermosetting resin include a thermosetting epoxy resin, thermosetting urea resin, thermosetting melamine resin, or thermosetting phenol resin. Of these thermosetting resins, thermosetting epoxy resins are particularly preferred in view of their strong adhesion after curing.

Such thermosetting epoxy resins may be either liquid or solid and typically have an epoxy equivalent of about 100 to about 4000. These thermosetting epoxy resins preferably include two or more epoxy groups in their molecules. Preferred examples include bisphenol A epoxy compounds, phenol novolac epoxy compounds, cresol novolac epoxy compounds, ester epoxy compounds, and alicyclic epoxy compounds. These compounds may be monomers or oligomers.

When necessary, fillers such as silica and mica, pigments and antistats may be added to the thermosetting resin composition of the present invention. Preferably, the thermosetting resin composition of the present invention contains 1 to 10 mass % of conductive particles, metal particles or resin cores of the order of several micrometers covered with metal plating layer, which may further be covered with insulation film. This allows the use of the thermosetting resin composition of the present invention as an anisotropic conductive adhesive paste or anisotropic conductive film.

The thermosetting resin composition of the present invention can be produced by uniformly mixing the latent curing agent, the silane coupling agent, the thermosetting resin and other optional additives according to conventional techniques.

The thermosetting resin composition so obtained contains the curing agent in its latent state and is thus highly stable during storage despite its one-pack type composition.

Furthermore, the latent curing agent cooperates with the silane coupling agent to cause the thermosetting resin to undergo cationic polymerization quickly and at low temperatures.

EXAMPLES

The present invention will now be described in detail with reference to examples.

Example 1

800 parts by weight of distilled water, 0.05 parts by weight of a surfactant (Newrex, available from NOF Co., Ltd.), and 4 parts by weight of polyvinyl alcohol (PVA-205, available from KURARAY Co., Ltd.) to serve as a dispersing agent were placed in a three-liter thermometer-equipped vessel intended for interfacial polymerization, and the mixture was thoroughly mixed. Meanwhile, 11 parts by weight of a 24% isopropanol solution of aluminum monoacetylacetonate bis (ethylacetoacetate) (Alumichelate D, available from KAWAKEN FINE CHEMICALS Co., Ltd.) and 11 parts by weight of a methylenediphenyl-4,4'-diisocyanate (3 mol)/trimethylolpropane (1 mol) adduct (D-109, available from MITSUI TAKEDA CHEMICALS Inc.) were dissolved in 30 parts by weight of ethyl acetate to form an organic phase solution. This solution was added to the above-prepared mixture and the resulting mixture was emulsified by a homogenizer (at 11000 rpm for 10 min). Then, the interfacial polymerization was allowed to proceed overnight at 60° C.

Upon completion of the reaction, the reaction mixture was allowed to cool down to room temperature. The particles resulting from the interfacial polymerization were then collected by filtration and were allowed to dry to give 20 parts by weight of a spherical latent curing agent sized approximately 10 µm.

Example 2

The same procedure was followed as in Example 1, except that toluene diisocyanate (3 mol)/methylenediphenyl-4,4'-diisocyanate (3 mol)/trimethylolpropane (1 mol) adduct (D-103M-2, MITSUI TAKEDA CHEMICALS Inc.) was used in place of methylenediphenyl-4,4'-diisocyanate (3 mol)/trimethylolpropane (1 mol) adduct, to obtain 20 parts by weight of a spherical latent curing agent sized approximately 10 µm.

Example 3

The same procedure was followed as in Example 1, except that toluene diisocyanate (3 mol)/trimethylolpropane (1 mol) adduct (D-103, available from MITSUI TAKEDA CHEMICALS Inc.) was used in place of methylenediphenyl-4,4'-diisocyanate (3 mol)/trimethylolpropane (1 mol) adduct, to obtain 20 parts by weight of a spherical latent curing agent sized approximately 10 µm.

Example 4

The same procedure was followed as in Example 1, except that m-xylylene diisocyanate (3 mol)/trimethylolpropane (1 mol) adduct (D-110N, available from MITSUI TAKEDA CHEMICALS Inc.) was used in place of methylenediphenyl-4,4'-diisocyanate (3 mol)/trimethylolpropane (1 mol) adduct, to obtain 20 parts by weight of a spherical latent curing agent sized approximately 10 µm.

Example 5

The same procedure was followed as in Example 1, except that hexahydro-m-xylylene diisocyanate (3 mol)/trimethylolpropane (1 mol) adduct (D-120N, available form MITSUI TAKEDA CHEMICALS Inc.) was used in place of methylenediphenyl-4,4'-diisocyanate (3 mol)/trimethylolpropane (1 mol) adduct, to obtain 20 parts by weight of a spherical latent curing agent sized approximately 10 µm.

Example 6

The same procedure was followed as in Example 1, except that isophorone diisocyanate (3 mol)/trimethylolpropane (1 mol) adduct (D-140N, available from MITSUI TAKEDA CHEMICALS Inc.) was used in place of methylenediphenyl-4,4'-diisocyanate (3 mol)/trimethylolpropane (1 mol) adduct, to obtain 20 parts by weight of a spherical latent curing agent sized approximately 10 µm.

Example 7

The same procedure was followed as in Example 1, except that isocyanurate form of isophorone diisocyanate (Z-4470, available from SUMITOMO BAYER URETHANE Co., Ltd.) was used in place of methylenediphenyl-4,4'-diisocyanate (3 mol)/trimethylolpropane (1 mol) adduct, to obtain 20 parts by weight of a spherical latent curing agent sized approximately 10 µm.

Example 8

2 parts by weight of each of the latent curing agents obtained in Examples 1 through 7, 90 parts by weight of an alicyclic epoxy resin (CEL-2021P, available from DAICEL CHEMICAL INDUSTRIES Co., Ltd.), and 8 parts by weight of a silane coupling agent (A-187, available from NIPPON UNICAR Co., Ltd.) were thoroughly mixed to form thermosetting epoxy resin compositions. Each composition was analyzed using a differential scanning calorimeter (DSC6200, available from SEIKO INSTRUMENT Co., Ltd.). The results are shown in Table 1 and FIG. 2. With regard to the curing characteristics of the latent curing agents, the heat generation initiation temperature corresponds to a temperature at which the composition starts to cure, the heat generation peak corresponds to a temperature at which the curing of the composition is at its peak, the heat generation termination temperature corresponds to a temperature at which the curing of the composition completes, and the peak area corresponds to the amount of heat generated.

TABLE 1

| Latent curing agent | Heat generation initiation temperature (° C.) | Glass transition temperature (° C.) | Heat generation peak (° C.) | Heat generation termination temperature (° C.) | Peak area (mJ/mg) |
| --- | --- | --- | --- | --- | --- |
| Example 1 | 75 | No measurement | 106 | 203 | −478.425 |
| Example 2 | 103 | No measurement | 131 | 214 | −368.224 |

TABLE 1-continued

| Latent curing agent | Heat generation initiation temperature (° C.) | Glass transition temperature (° C.) | Heat generation peak (° C.) | Heat generation termination temperature (° C.) | Peak area (mJ/mg) |
|---|---|---|---|---|---|
| Example 3 | 136 | 206 | 160 | 206 | −251.807 |
| Example 4 | 124 | 122 | 148 | 232 | −100.666 |
| Example 5 | 101 | 147 | 131 | 239 | −220.929 |
| Example 6 | 131 | 203 | 158 | 228 | −204.317 |
| Example 7 | 118 | No measurement | 149 | 218 | −211.21 |

Figure 2:
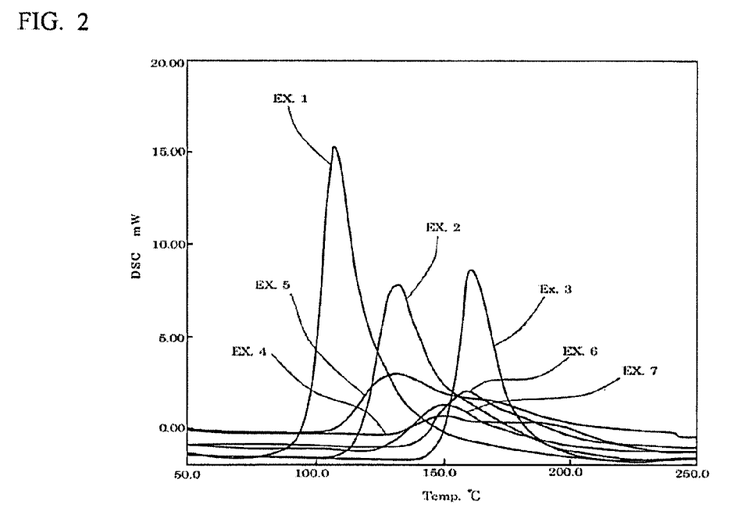
FIG. 2 is a DSC (differential scanning calorimetry) diagram of a thermosetting epoxy resin prepared in Example 8.

As shown in Table 1 and FIG. 2, the results for the latent curing agents of Examples 1 through 6 indicate that the curing characteristics of the latent curing agent can be controlled by changing the type of the polyfunctional isocyanate compound. The latent curing agent of Example 1 started to cure the thermosetting composition at a temperature equal to or lower than 100° C.

The results also indicate that the heat generation initiation temperature, the heat generation peak temperature and the heat generation termination temperature tend to shift to higher temperatures (i.e., the curing temperature is increased) as the glass transition point of the polyurea structure becomes higher (Examples 3 through 6).

Example 9

Figure 3:
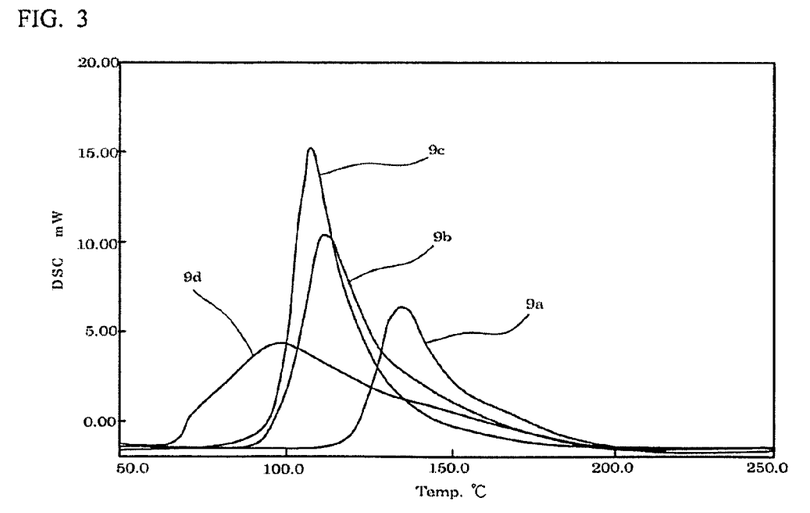
FIG. 3 is a DSC diagram of a thermosetting epoxy resin prepared in Example 9.

Latent curing agents were prepared in the same manner as in Example 1, except that the amount of the 24% isopropanol solution of aluminum monoacetylacetonate bis(ethylacetoacetate) (Alumichelate D, available from KAWAKEN FINE CHEMICALS Co., Ltd.) to serve as the aluminum chelating agent was changed as shown in Table 2 (Experiment Examples 9a through 9e). The results of Table 2 indicate that the polymer particles tend to aggregate as the amount of the aluminum chelating agent is increased and particles of the interfacial polymer can no longer be obtained as the aluminum chelating agent is further increased. It is also shown that the heat generation peak decreases as the aluminum chelating agent is increased (FIG. 3).

TABLE 2

| Experiment Example | Aluminum chelating agent (Parts by weight) | Particles of interfacial polymer | Heat generation peak (° C.) |
|---|---|---|---|
| 9a | 2.78 | Obtained | 134 |
| 9b | 5.55 | Obtained | 111 |
| 9c | 11.10 | Obtained | 103 |
| 9d | 16.65 | Aggregate formation | 97 |
| 9e | 22.20 | No particle formation | — |

Example 10

2 parts by weight of the latent curing agent obtained in Example 1, 90 parts by weight of an alicyclic epoxy resin (CEL-2021P, available from DAICEL CHEMICAL INDUSTRIES Co., Ltd.), and 8 parts by weight of each of the silane coupling agents shown in Table 3 were thoroughly mixed to obtain thermosetting epoxy resin compositions (Experiment Examples 10a through 10h).

Figure 4:
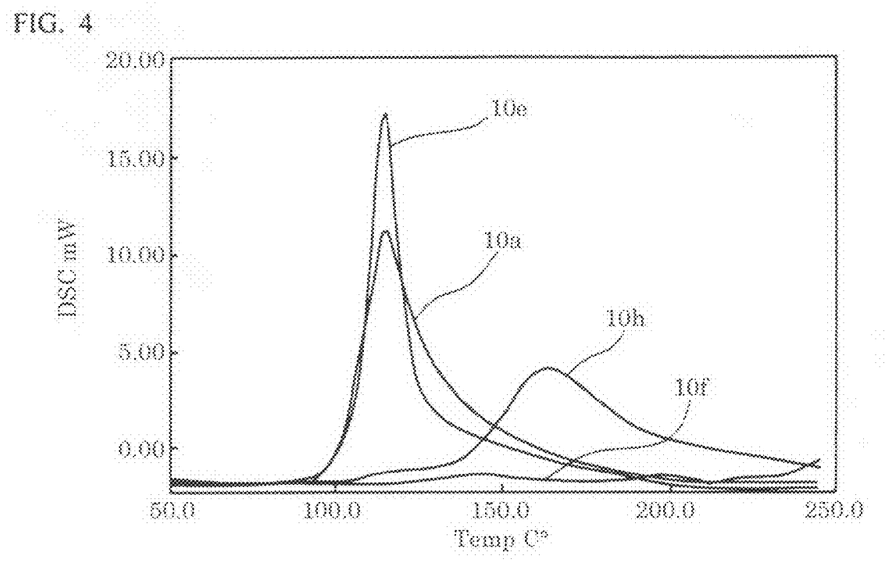
FIG. 4 is a DSC diagram of a thermosetting epoxy resin prepared in Example 10.
Figure 5A:
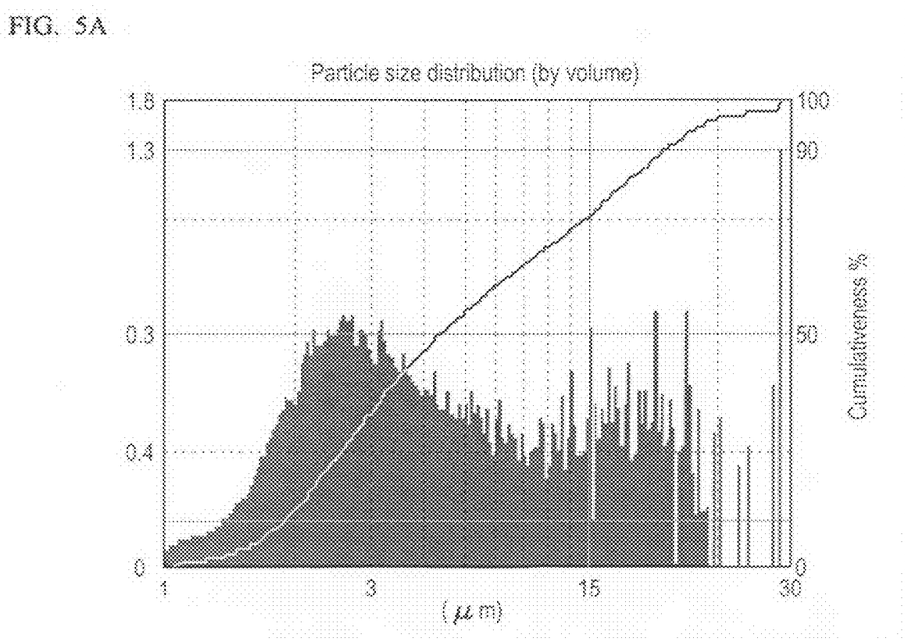
FIG. 5A is a chart showing a particle size distribution of a latent curing agent prepared in Experiment Example 11b of Example 11.
Figure 5B:
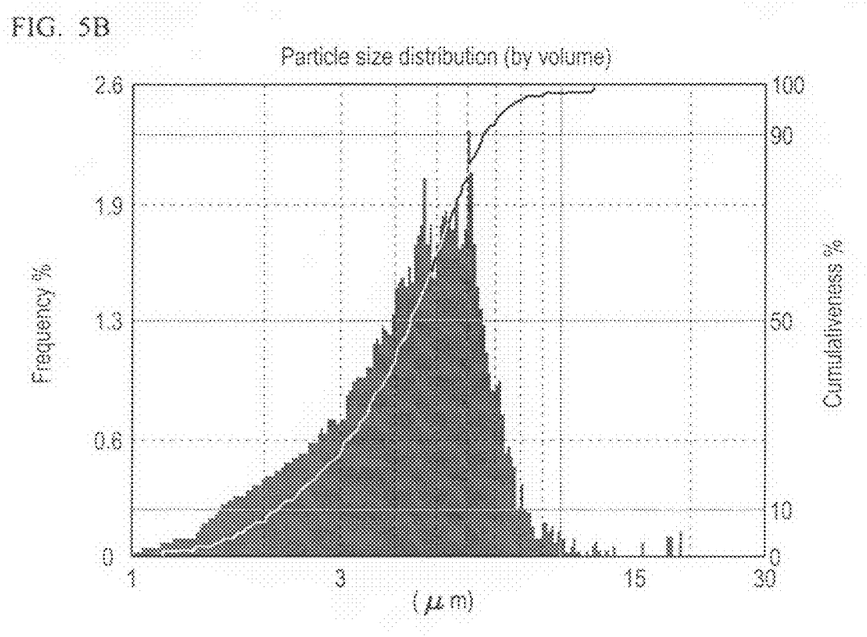
FIG. 5B is a chart showing a particle size distribution of a latent curing agent prepared in Experiment Example 11c of Example 11.
Figure 5C:
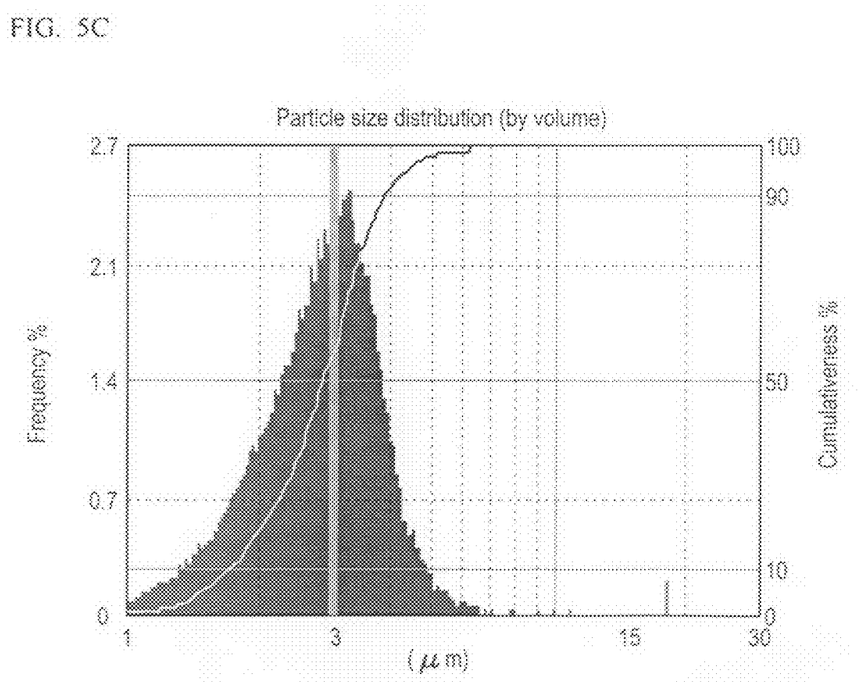
FIG. 5C is a chart showing a particle size distribution of a latent curing agent prepared in Experiment Example 11d of Example 11.
Figure 5D:
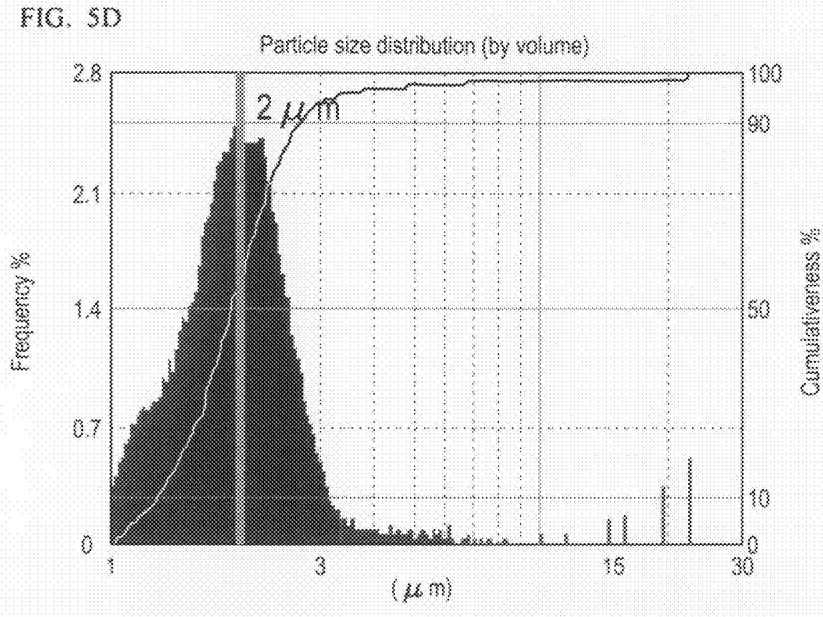
FIG. 5D is a chart showing a particle size distribution of a latent curing agent prepared in Experiment Example 11e of Example 11.

Each of the composition obtained was analyzed using a differential scanning calorimeter (DSC6200, available from SEIKO INSTRUMENT Co., Ltd.). The results are shown in FIG. 4. The results of FIG. 4 indicate that the curing characteristics of the latent curing agent can be controlled by changing the type of the silane coupling agent.

TABLE 3

| Experiment Example | Silane coupling agent |
|---|---|
| 10a | γ-glycydoxypropyltrimethoxysilane (A-187, available from NIPPON UNICAR) |
| 10b | β-(3,4-epoxycyclohexyl)ethyltrimethoxysilane (KBM303, available from Shin-Etsu Chemical) |
| 10c | σ-styryltrimethoxysilane (KBM1403, available from Shin-Etsu Chemical) |
| 10d | γ-methacryloxypropyltrimethoxysilane (KBM503, available from Shin-Etsu Chemical) |
| 10e | γ-acryloxypropyltrimethoxysilane (KBM5103, available from Shin-Etsu Chemical) |
| 10f | γ-aminopropyltriethoxysilane (KBM903, available from Shin-Etsu Chemical) |
| 10g | γ-chloropropyltrimethoxysilane (KBM703, available from Shin-Etsu Chemical) |
| 10h | γ-mercaptopropyltrimethoxysilane (KBM803, available from Shin-Etsu Chemical) |

Example 11

To examine the effect of the viscosity of the organic phase solution on the particle size distribution of the latent curing particles, latent curing agents of Experiment Examples 11a through 11e were prepared. The curing agents were prepared in the same manner as in Example 1, except that the amount of ethyl acetate in the organic phase solution prepared in Example 1 (in which aluminum monoacetylacetonate bis(ethylacetoacetate) and methylenediphenyl-4,4'-diisocyanate (3 mol)/trimethylolpropane (1 mol) adduct were dissolved in ethyl acetate) was increased to change the viscosity of the solution as shown in Table 4. Experiment Example 11b corresponded to Example 1.

The organic phase solutions were analyzed for the viscosity by a rheometer PK 100 (available from HAAKE). The results are shown in Table 4.

TABLE 4

| Experiment Examples | Viscosity of organic phase (mPa · S) | Note |
|---|---|---|
| 11a | 224.9 | No solvent |
| 11b | 5.521 | Equivalent to Example 1 |
| 11c | 2.535 | — |
| 11d | 2.074 | — |
| 11e | 1.321 | — |

Figure 6A:
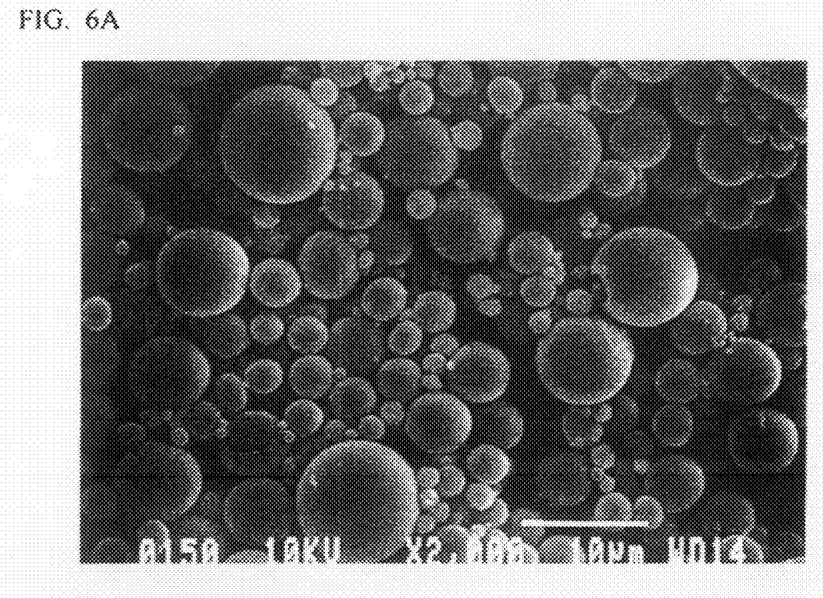
FIG. 6A is an electron micrograph of the latent curing agent of Experiment Example 11b of Example 11.
Figure 6B:
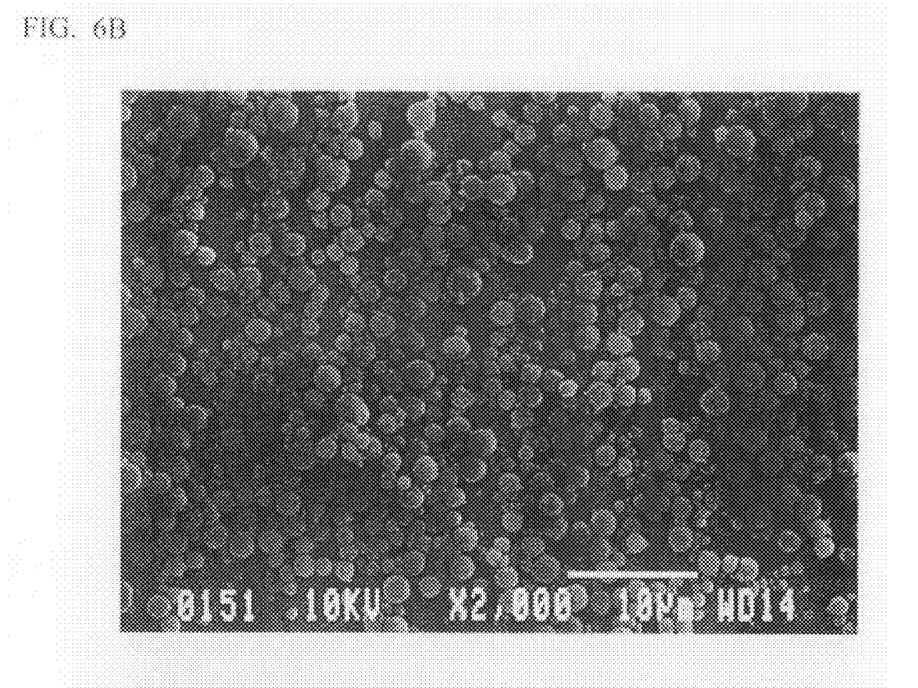
FIG. 6B is an electron micrograph of the latent curing agent of Experiment Example 11e of Example 11.
Figure 7A:
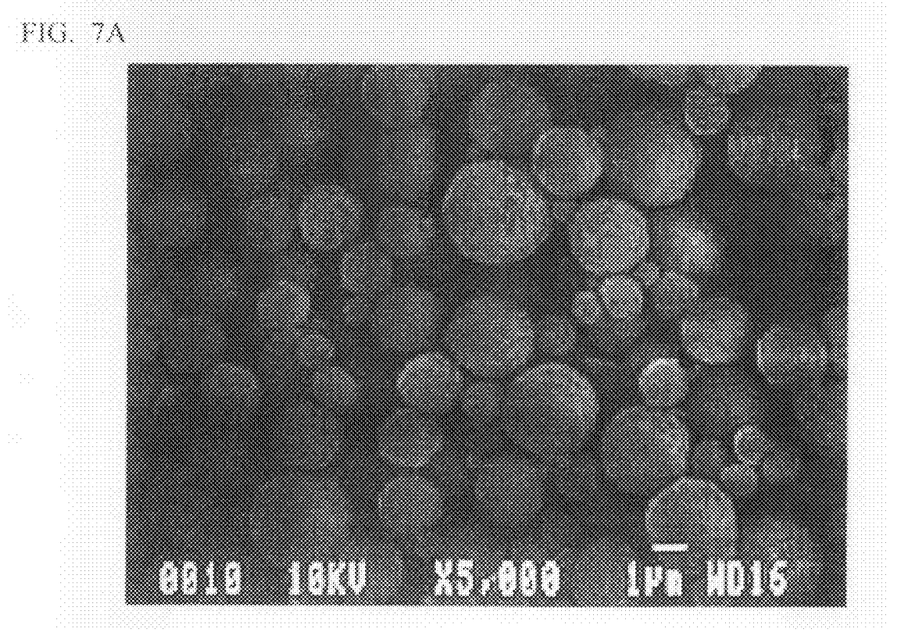
FIG. 7A is an electron micrograph of a latent curing agent of Experiment Example 12a of Example 12.
Figure 7B:
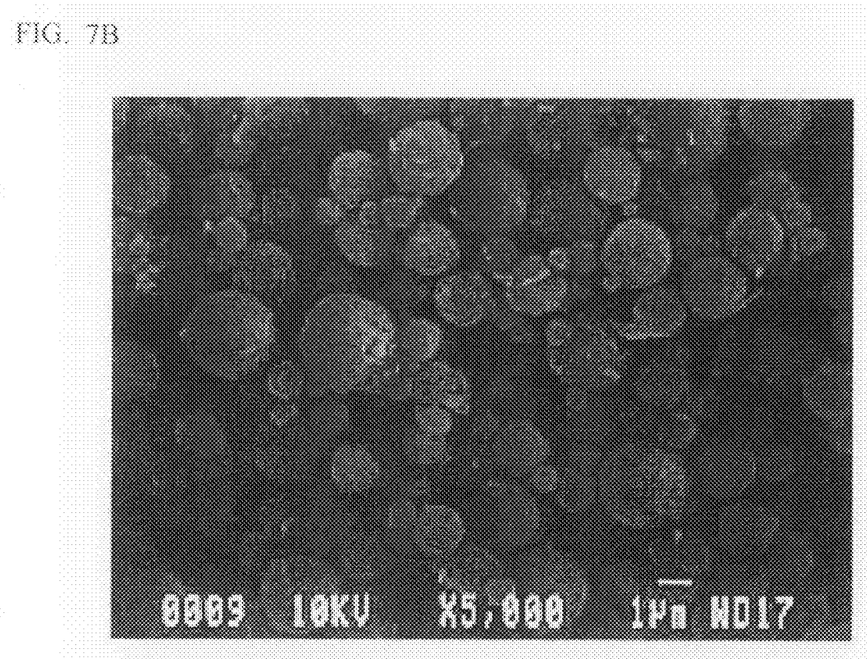
FIG. 7B is an electron micrograph of a latent curing agent of Experiment Example 12b of Example 12.
Figure 7C:
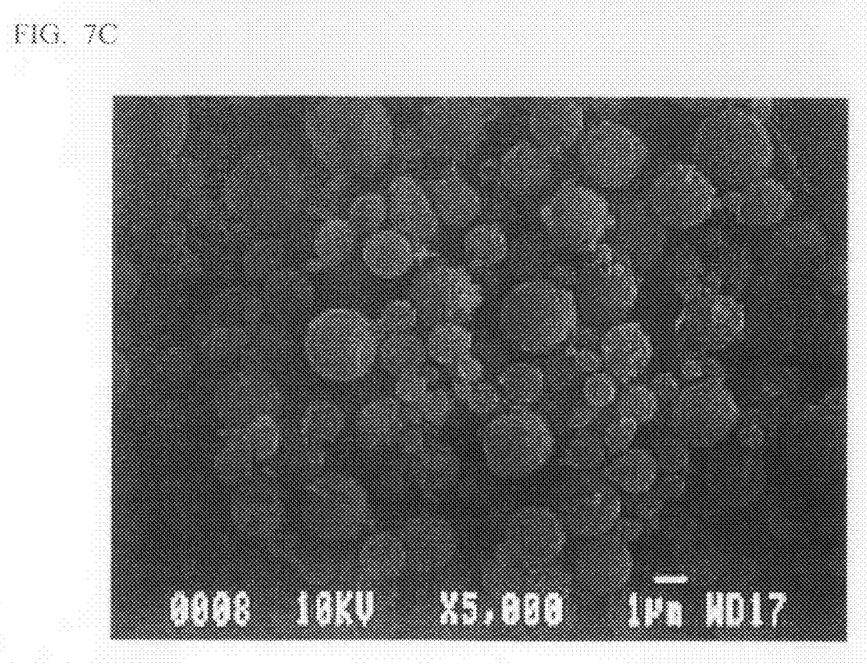
FIG. 7C is an electron micrograph of a latent curing agent of Experiment Example 12c of Example 12.
Figure 7D:
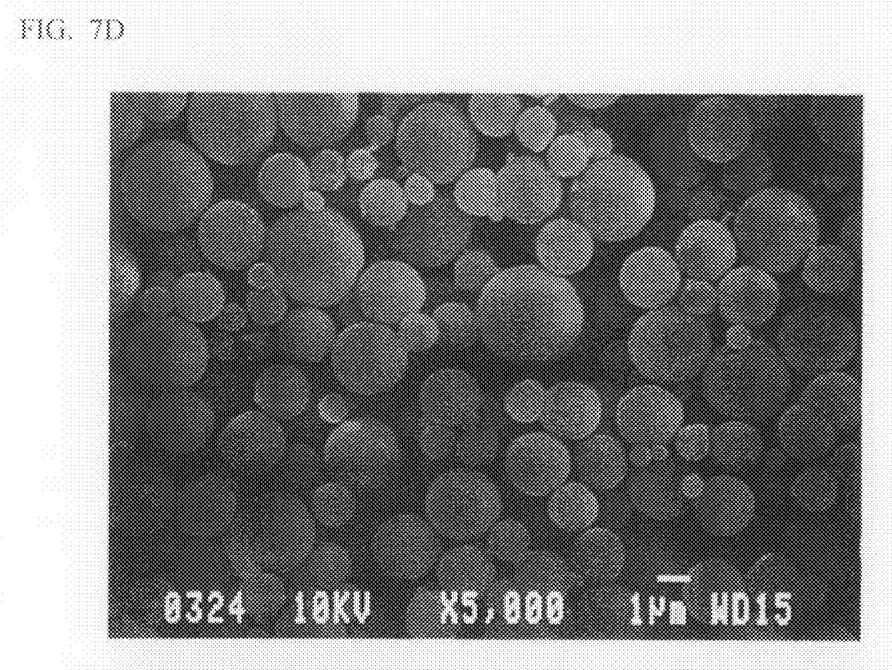
FIG. 7D is an electron micrograph of a latent curing agent of Experiment Example 12d of Example 12.
Figure 7E:
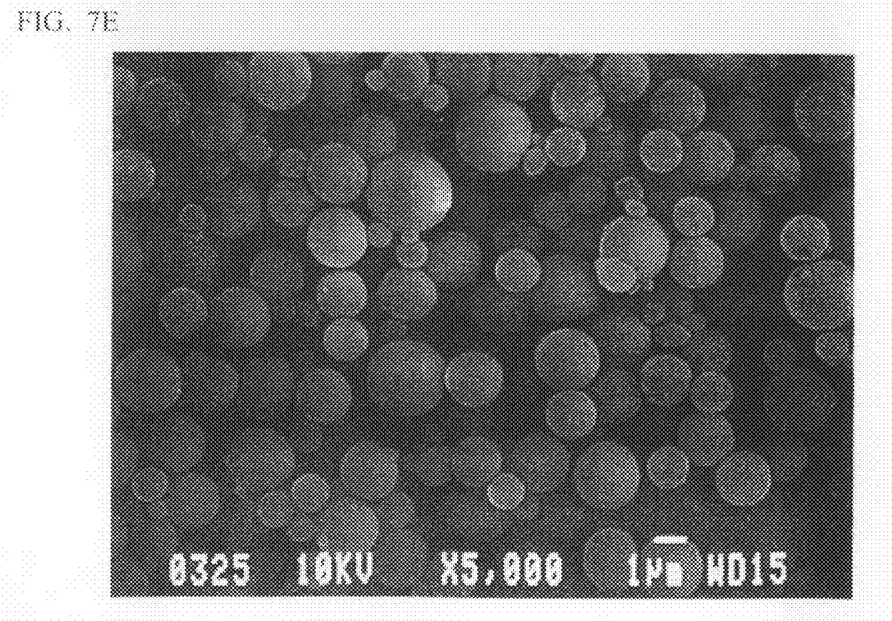
FIG. 7E is an electron micrograph of a latent curing agent of Experiment Example 12e of Example 12.
Figure 7F:
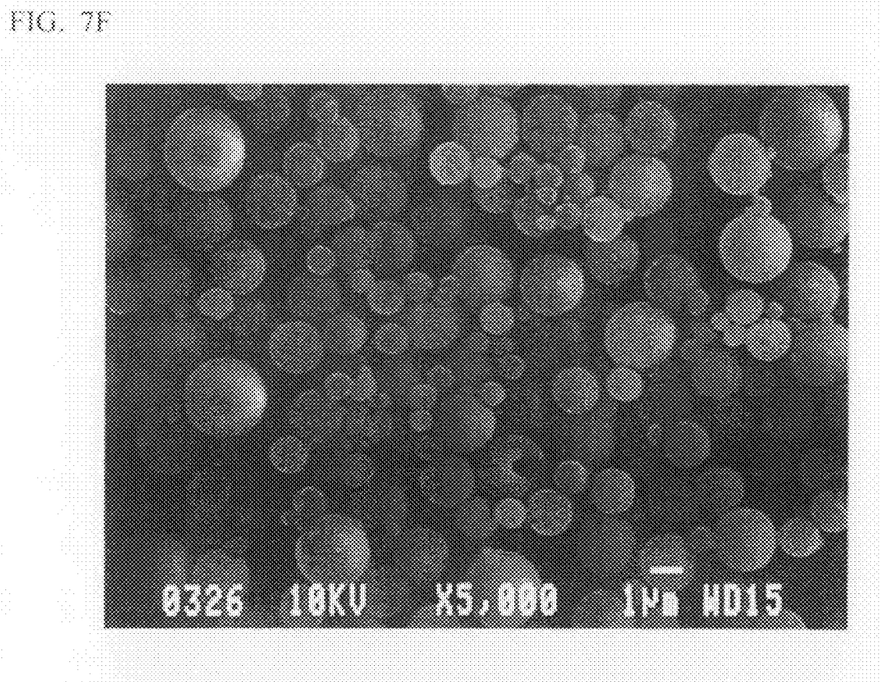
FIG. 7F is an electron micrograph of a latent curing agent of Experiment Example 12f of Example 12.

The particle size distribution of the latent curing agents of Experiment Examples 11b through 11e were measured by a sheath flow particle size distribution analyzer (SD-2000, available from Sysmex). FIGS. 5A through 5D show the size distribution charts (by volume) for the latent curing agents. As shown by the charts, the particle size distribution was a normal distribution when the viscosity of the organic phase was 2.5 mPa·S. Moreover, monodisperse emulsion particles having a size in the order of microns (center diameter=3 μm) were obtained when the viscosity of the organic phase was 2.0 mPa·S. Monodisperse emulsion particles having a size in the order of microns (center diameter=2 μm) were also obtained when the viscosity of the organic phase was 1.3 mPa·S. These results suggest that monodisperse emulsion particles can be effectively obtained by adjusting the viscosity of the organic phase in the range of 1 to 2.5 mPa·S. FIGS. 6A and 6B are electron micrographs of the particles of the latent curing agents of Experiment Examples 11b and 11e, respectively. These photographs also demonstrate that the size distribution of the particles of the latent curing agent of Experiment Example 11e show a better monodispersion pattern than the latent curing agent of Experiment Example 11a.

Example 12

To obtain particles of a latent curing agent with good monodisperse property and good surface condition, the polyfunctional isocyanate compound and the aluminum chelating agent were mixed in different proportions. The amount of ethyl acetate used was the same as in Example 11e to make monodisperse particles. Specifically, latent curing agents of Experiment Examples 12a through 12f were prepared in the same manner as in Example 1, except that the amounts of the aluminum chelating agent and the polyfunctional isocyanate compound in the organic phase solution (in which aluminum monoacetylacetonate bis(ethylacetoacetate) (aluminum chelating agent) and methylenediphenyl-4,4'-diisocyanate (3 mol)/trimethylolpropane (1 mol) adduct (polyfunctional isocyanate compound) were dissolved the same amount of ethyl acetate as in Example 11e) were changed as shown in Table 5 below.

TABLE 5

| Experiment Examples | Aluminum chelating agent (Parts by weight) | Polyfunctional isocyanate compound (Parts by weight) |
|---|---|---|
| 12a | 5.0 | 11.0 |
| 12b | 6.0 | 11.0 |
| 12c | 10.0 | 11.0 |
| 12d | 11.0 | 11.0 |
| 12e | 14.0 | 11.0 |
| 12f | 17.0 | 11.0 |

Electron micrographs of the resulting latent curing agents of Experiment Examples 12a through 12f are shown in FIGS. 7A through 7F, respectively. The size of the particles of the resulting latent curing agents could be controlled to at most 5 μm in diameter since fine oil particles were formed before the polymerization took place. The results also indicate that the deposition of undesired materials around the particles can be avoided by adjusting the amount of the aluminum chelating agent to one-half or less (by weight) of the polyfunctional isocyanate compound. The deposition of unwanted materials can also be avoided by adding an equal amount or more (by weight) of the aluminum chelating agent than the polyfunctional isocyanate compound. Thus, when it is desired to make particles of the latent curing agent that have good monodisperse property and good surface condition, the amount of the aluminum chelating agent is preferably adjusted to one-half or less, or the same amount or more (by weight), of the polyfunctional isocyanate compound.

INDUSTRIAL APPLICABILITY

The aluminum chelator-based latent curing agent of the present invention can cure thermosetting epoxy resins in a relatively short period of time and at a relatively low temperature and is thus suitable for use as a curing agent for anisotropic conductive adhesives that are used to form anisotropic connection quickly and at low temperatures.

The invention claimed is:

1. A latent curing agent comprising an aluminum chelating agent and a carrier made from a porous resin obtained through interfacial polymerization of a polyfunctional isocyanate compound, aluminum chelating agent being retained in pores formed inside and on an outer surface of the carrier.

2. The latent curing agent according to claim 1, wherein the aluminum chelating agent is a complex compound in which a β-ketoenolate anion ligand is coordinated to aluminum.

3. A thermosetting resin composition containing the latent curing agent according to claim 2, a silane coupling agent, and a thermosetting resin.

4. The latent curing agent according to claim 1, wherein the aluminum chelating agent is aluminum monoacetylacetonate bis(ethylacetoacetate).

5. A thermosetting resin composition containing the latent curing agent according to claim 4, a silane coupling agent, and a thermosetting resin.

6. A method for producing the latent curing agent according to claim 1, comprising:
dissolving the aluminum chelating agent and the polyfunctional isocyanate compound in a volatile organic solvent;
adding the resulting solution to an aqueous phase containing a dispersing agent; and
stirring the resulting mixture while the mixture is heated to cause interfacial polymerization of the isocyanate compound.

7. The method according to claim 6, wherein the volatile organic solvent is an acetic acid lower alkyl ester.

8. The method according to claim 7, wherein the aluminum chelating agent is used in an amount of an equal amount or more by weight of the polyfunctional isocyanate compound.

9. The method according to claim 6, wherein the aluminum chelating agent is used in an amount of one-half or less by weight of the polyfunctional isocyanate compound.

10. The method according to claim 6, wherein the aluminum chelating agent is used in an amount of an equal amount or more by weight of the polyfunctional isocyanate compound.

11. A thermosetting resin composition containing the latent curing agent according to claim 1, a silane coupling agent, and a thermosetting resin.

12. The thermosetting resin composition according to claim 11, wherein the thermosetting resin is a thermosetting epoxy resin.

13. The latent curing agent according to claim 1, wherein the pores are sized from 5 to 150 nm.

14. The latent curing agent according to claim 1, wherein the aluminum chelating agent retained in the pores formed on the outer surface of the carrier is inactivated by water present in a reaction system during the interfacial polymerization, and the aluminum chelating agent retained in the pores formed inside of the carrier remains active.

15. The latent curing agent according to claim 1, wherein, in the latent curing agent, the aluminum chelating agent is present in an amount of 10 to 200 parts by mass relative to 100 parts by mass of the porous resin.

* * * * *